United States Patent [19]
Adams

[11] 4,368,425
[45] Jan. 11, 1983

[54] SYSTEM FOR AND METHOD OF TESTING TRANSISTORS

[75] Inventor: Robert W. Adams, Medford, Mass.

[73] Assignee: DBX, Inc., Newton, Mass.

[21] Appl. No.: 209,894

[22] Filed: Nov. 24, 1980

[51] Int. Cl.³ .............................................. G01R 31/22
[52] U.S. Cl. ................................................ 324/158 T
[58] Field of Search .............. 324/158 T, 158 D, 73 R

[56] References Cited
PUBLICATIONS

Alden, et al., "Pulsed Measuring . . . ;" Electronics Letters; vol. 9; No. 4; Feb. 22, 1973; pp. 82-83.

Primary Examiner—Ernest F. Karlsen
Attorney, Agent, or Firm—Schiller & Pandiscio

[57] ABSTRACT

An improved system for and method of testing a transistor for its $V_{be}$-$I_c$ characteristics independent of temperature is disclosed. The system for carrying out the method comprises means for generating a first signal which varies with temperature in accordance with the base-to-emitter voltage of the transistor as a function of temperature and means for generating a second signal which varies with temperature in accordance with the transconductance gain of the transistor as a function of temperature. Means are provided for modifying at least one of the first and second signals so that as modified the two signals vary with temperature in an equal and opposite manner to one another. The system also includes means for adding the two signals as modified so as to provide an output signal representative of the $V_{be}$-$I_c$ characteristics of the transistor independent of temperature.

10 Claims, 6 Drawing Figures

SYSTEM FOR AND METHOD OF TESTING TRANSISTORS

The present invention relates to a system for and method of testing transistors for their base-to-emitter voltage ($V_{be}$) to collector current ($I_c$) characteristics independent of temperature.

Many circuit designs comprise a plurality of transistors which are mutually dependent upon one another such that they must operate in a substantially identical manner through changes in ambient temperature. For example, a multiplying circuit of the type shown and described in U.S. Pat. No. 3,714,462 issued to David E. Blackmer on Jan. 30, 1973 requires non transistors which must be matched for their $V_{be}$-$I_c$ characteristics, and pnp transistors which must be similarly matched. Although transistors may be of the same type, i.e. identically made, for a given DC collector current at ambient temperature the DC base-to-emitter voltage of one transistor may vary from the base-to-emitter voltage of another transistor of the same type such that the two transistors have different $V_{be}$-$I_c$ characteristics. These transistors can also exhibit different transconductance (i.e. AC base-to-emitter voltage to AC collector current) gains. Placing transistors displaying different $V_{be}$-$I_c$ characteristics and different transconductance gains in a circuit which requires transistors to be matched can result in errors and even malfunctioning of the particular circuit. Accordingly, it is preferred to test transistors to match their $V_{be}$-$I_c$ characteristics when manufacturing such circuits.

Heretofore it has been necessary to test transistors in a temperature-controlled environment so that the $V_{be}$-$I_c$ characteristics of each transistor can be tested. Typically, a plurality of transistors are placed in an oven where each are subject to the same constant collector current. The oven temperature is varied through a range of temperatures. The base-to-emitter voltage of each transistor can then be measured at each desired temperature and the $V_{be}$ to temperature function $V_{be}(T)$ empirically determined for each transistor. By matching those transistors exhibiting the same $V_{be}(T)$ function, one will match both the $V_{be}$-$I_c$ characteristics and transconductance gain, $g_m$, of the transistors.

It should be obvious, however, that the requirement of the use of an oven to test the transistors can increase the manufacturing costs of the circuits due to increases in capital costs for the oven and its associated parts, additional labor costs due to the amount of time expended waiting for the oven to heat and subsequently cool through the range of temperatures desired for testing each group of transistors, and the limitations on the number of transistors which can be tested as a group with each oven temperature cycle.

It is a general object of the present invention to provide an improved system for and method of testing transistors for their $V_{be}$-$I_c$ characteristics independent of temperature.

Another object of the present invention is to provide an improved system for and method of matching transistors for their $V_{be}$-$I_c$ characteristics.

And another object of the present invention is to provide an improved system for and method of testing transistors for their $V_{be}$-$I_c$ characteristics at a predetermined reference temperature independent of ambient temperature.

Still another object of the present invention is to provide an improved system for and method of matching transistors for their $V_{be}$-$I_c$ characteristics without the need for a temperature controlled environment.

These and other objects are achieved by an improved system for and method of testing a transistor for its $V_{be}$-$I_c$ characteristics independent of temperature. The system of the present invention for carrying out the method of the present invention comprises means for generating a first signal which varies with temperature in accordance with the base-to-emitter voltage of the transistor as a function of temperature and means for generating a second signal which varies with temperature in accordance with the transconductance gain of the transistor as a function of temperature. Means are provided for modifying at least one of the first and second signals so that as modified the two signals vary with temperature in an equal and opposite manner to one another. The system also includes means for adding the two signals as modified so as to provide an output signal representative of the $V_{be}$-$I_c$ characteristics of the transistor independent of temperature.

Other objects of the invention will in part be obvious and will in part appear hereinafter. The invention accordingly comprises the processes involving several steps and the relation and order of one or more of such steps with respect to each of the others, and the apparatus possessing the construction, combination of elements and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

Referring to the drawings, wherein like numerals are used to designate like or similar parts, the graphs of FIGS. 1-4 are used to illustrate the principles of the present invention.

FIG. 1 shows the relationship of the transconductance gain of a transistor to ambient temperature, when a constant current is provided. More particularly, as well known, the transconductance gain bears the following relationship to temperature:

$$g_m = (q/KT) I_c; \qquad (1)$$

where
 $g_m$ = the transconductance gain of the transistor;
 q = the charge of an electron (a constant);
 K = the Boltzman's constant;

T = the ambient temperature (°K.) of the transistor; and $I_c$ = the collector current.

Thus, for constant collector current the transconductance gain of a transistor is inversely proportional to the ambient temperature. It therefore follows that $$1/g_m = (K/qI_c)T$$

Figure 2:
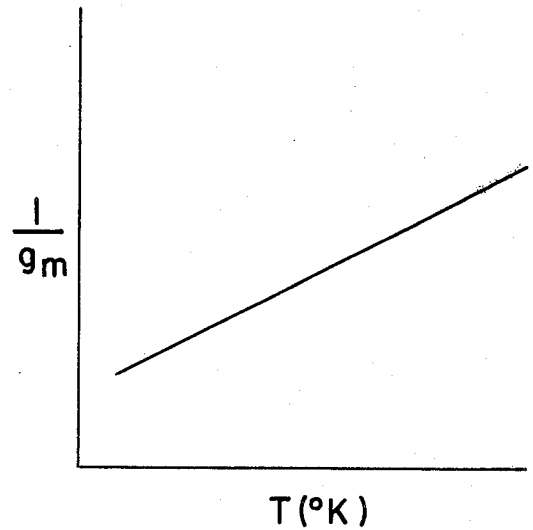
FIG. 2 is a graphical illustration of the inverse of the transconductance gain of a typical transistor as a function of temperature.

With the collector current held constant the inverse of the transconductance gain bears a linear relationship to ambient temperatures as shown in FIG. 2. The slope or first derivative of the curve shown in FIG. 2 is positive and equal to $(K/qI_c)$.

Figure 3:
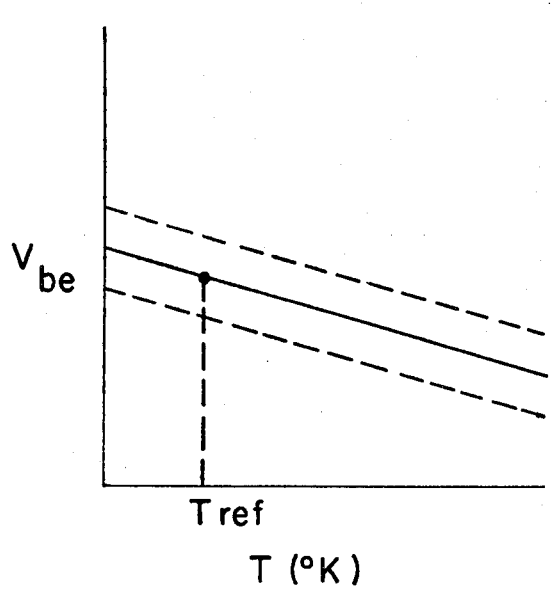
FIG. 3 is a graphical illustration of the base-to-emitter voltage of a typical transistor as a function of temperature.

The base-to-emitter voltage of a transistor is also a temperature dependent relationship as illustrated in FIG. 3. In particular the following approximate relationship is known:

$$I_c = I_s(e^{(q/KT)V_{be}}); \quad (3)$$

or $$V_{be} = (KT/q)\ln(I_c/I_s) \quad (4)$$

where $V_{be}$ = the base-to-emitter voltage of the transistor;
K = the Boltzman's constant
T = the ambient temperature
q = the charge of an electron (a constant)
$I_c$ = the collector current
$I_s$ = the reverse saturation current It is also a function of temperature, the value of which increases substantially linearly with increasing temperature.

Thus, equation (4) becomes $$V_{be} = (KT/q)\ln(I_c) - (KT/q)\ln(I_s) \quad (5)$$

Since the second term $(KT/q)\ln(I_s)$ of equation (5) increases at a faster rate than the first term $(KT/q)\ln(I_c)$, the resulting $V_{be}(T)$ curve shown in FIG. 3 is substantially linear with a slope or first derivative which is negative and substantially constant. Thus, equation (5) can be reduced to $$V_{be} = V_{be} \text{ at } T = T_{ref} - K_1 T \quad (6)$$

where $K_1$ = a constant $K_1$ is actually the slope of the line and varies slightly for different types of transistors, but is usually close to about 2 mv/°C.

It is the general approach of the present invention to provide the transistor under test with a constant collector current while generating two signals which respectively vary with temperature substantially in accordance with the FIGS. 2 and 3 curves. At least one of the signals is modified so that the two signals then vary with temperature in an equal but opposite manner. The two signals, as modified, can then be added to provide a resulting signal whose amplitude is independent of temperature.

Figure 4:
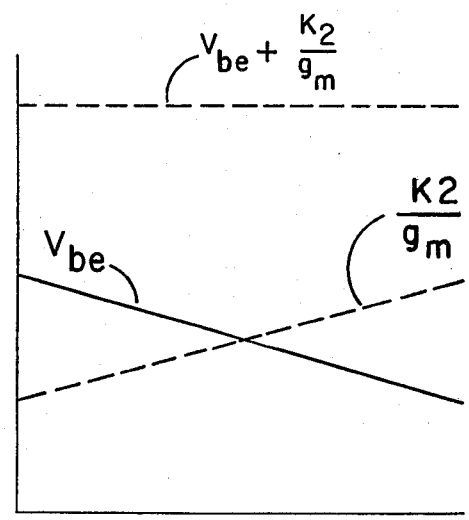
FIG. 4 is a graphical illustration of the operation of the system and method of the present invention in accomplishing the objects of the present invention.

The preferred approach is graphically illustrated in FIG. 4. As shown, the slope of the function of the inverse transconductance gain of FIG. 3 is adjusted by multiplying the function by a constant $K_2$. $K_2$ is selected so that the slope of the curve of $K_2/g_m$ as a function of temperature is substantially equal to but opposite from the slope of the curve of $V_{be}$ as a function of temperature. Adding the two curves, produces a third curve $V_{be} + K_2/g_m$ which is constant with respect to temperature; i.e. the slope of the resulting curve in FIG. 4 is zero.

The value of $K_2$ can easily be calculated as follows:

$$V_{be} + K_2/g_m = V_{be} \text{ at } T = T_{ref} - K_1 T + K_2(KT/qI_c) \quad (7)$$

$$V_{be} = V_{be} \text{ at } T = T_{ref} \quad (8)$$

when $$K_2 = (K_1 q I_c)/K \quad (9)$$

Figure 5:
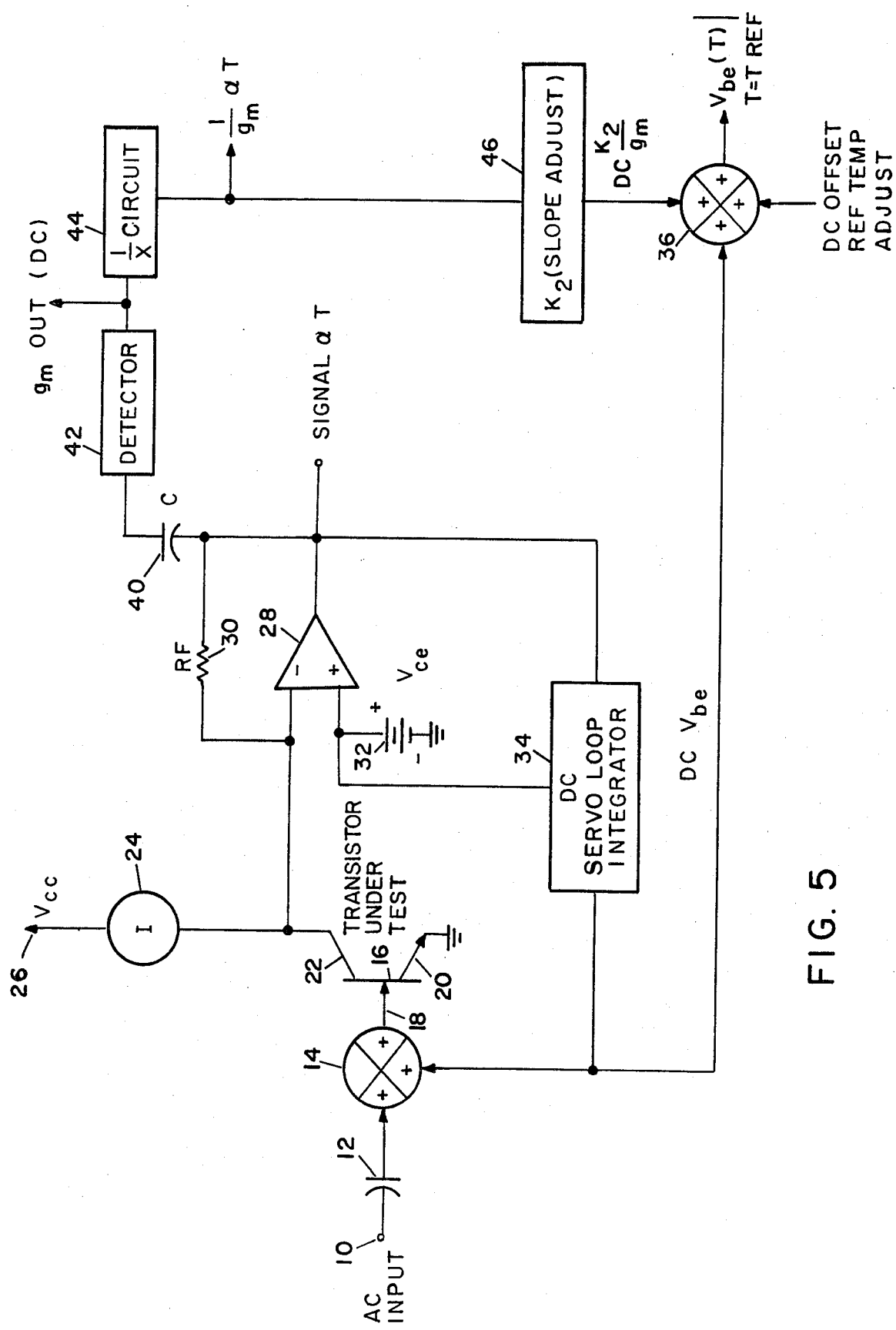
FIG. 5 is a block diagram of a first embodiment of the system of the present invention.
Figure 6:
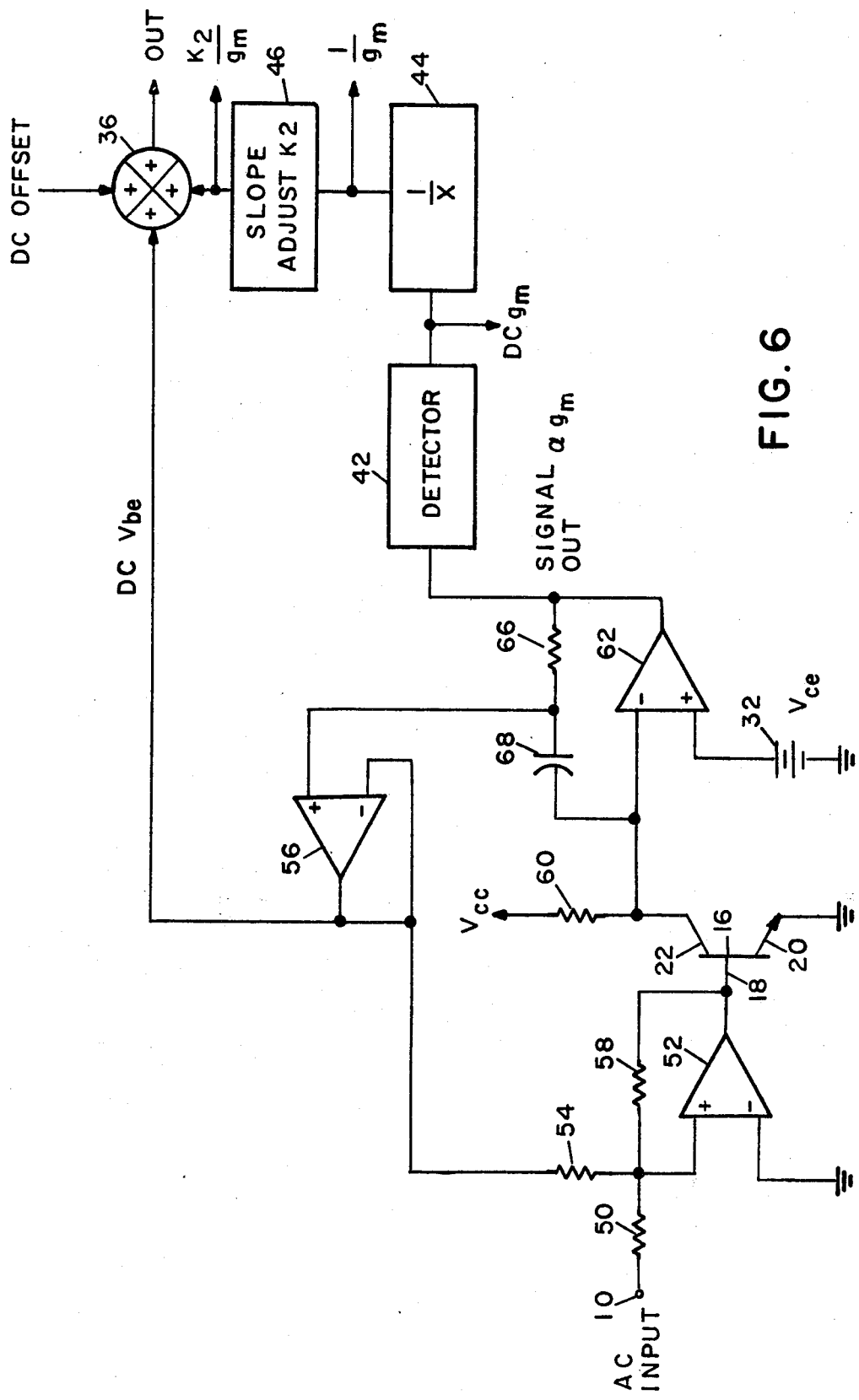
FIG. 6 is a block diagram of a second embodiment of the system of the present invention.

The conditions satisfying equations (8) and (9) can be satisfied by either of the systems shown in FIGS. 5 and 6. In both systems shown in FIGS. 5 and 6, the $V_{be}$-$I_c$ characteristics of the transistor under test can be measured independently of temperature when operating the transistor under test with a constant collector current. The DC base-to-emitter voltage thereby generated will vary with temperature in accordance with a positive sloped function similar to the one shown in FIG. 3.

Figure 1:
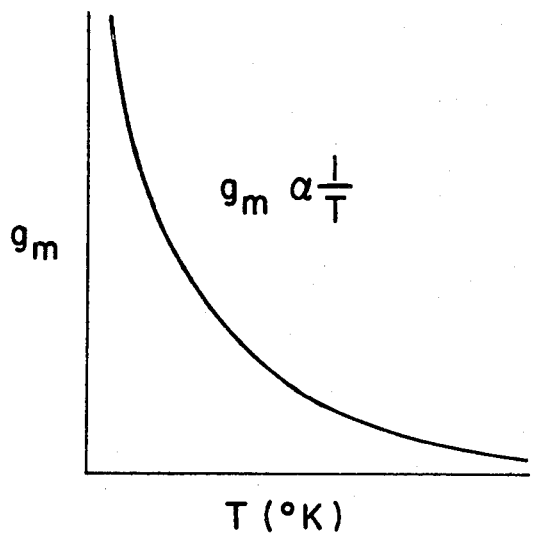
FIG. 1 is a graphical illustration of the transconductance gain of a typical transistor as a function of temperature.

An AC signal is applied to the base of the transistor so that an AC current amplified by the transistor is generated as a function of the transconductance gain of the transistor. This AC signal is converted to a DC signal which varies with temperature according to a function similar to the one illustrated in FIG. 1. This DC signal is operated upon so as to provide a DC signal which varies with temperature according to a function similar to the one illustrated in FIG. 2. The latter DC signal indicative of the inverse transconductance gain is multiplied by a factor $K_2$ so that the subsequent signal varies with temperature in accordance with a function similar to the $K_2/g_m$ curve shown in FIG. 4. The two DC signals, one indicative of $V_{be}$ and the other $K_2/g_m$ at the ambient temperature of the transistor are added giving a resulting DC signal equal to $V_{be} + K_2/g_m$ as shown in FIG. 4 independent of temperature and more particularly equal to $V_{be}$ at $T = T_{ref}$ since equation (9) is satisfied.

Referring to FIG. 5, the system shown includes an input terminal 10 for providing a test AC signal. Terminal 10 is connected through the AC coupling capacitor 12 to the input of the buffer and summing junction 14. The output of junction 14 is connected to the base 18 of the transistor 16 being tested. Transistor 16 has its emitter 20 connected to ground, while its collector 22 is connected to the source 24 of constant current, source 24 being biased by a constant voltage source at 26. The collector 22 is also connected to the negative input of the operational amplifier 28. Amplifier 28 which functions as a voltage to current converter has its negative input connected through resistor 30 to the output of the amplifier and its positive input connected to a positive DC voltage source 32. The output of amplifier 28 is connected to the input of the DC servo loop integrator 34 which in turn is biased by the DC voltage source 32 and has it output connected to a second input of the buffer and summing junction 14. The output of integrator 34 is also connected to an input of the buffer and summing junction 36.

The output of amplifier 28 is also connected through the AC coupling capacitor 40 to the input of a signal detector 42 the latter is preferably of the type which provides at its output a DC signal which is the average of its input. Preferably, detector 42 is an RMS detector, although other types of detectors are well known.

The output of detector 42 is connected to the input of an inverting or 1/x circuit 44. The output of circuit 44 is connected to the multiplying circuit 46 for multiplying the output of circuit 44 by the constant $K_2$. In the preferred embodiment $K_2$ is less than 1 so that circuit 46 can be a scaler. The output of current 46 is connected to the second input of junction 36. Finally, if desired a DC offset signal can be provided to the junction 36 to raise or lower the output of the junction 36 to the base-emitter voltage level at particular predetermined reference temperature value as will be more apparent hereinafter.

In operation, a collector current is provided through the collector 22 of transistor 16 by the current source 24 and voltage source 26. In order for transistor 16 to operate at a preselected current from the source 24, the collector 22 and base 18 of transistor 16 are connected to a DC servo loop comprising the operational amplifier 28, and the DC servo loop integrator 34. Specifically, the DC collector current of transistor 16 is applied to the negative input of operational amplifier 28. The latter functions as a current-to-voltage converter so that its DC voltage output is proportional to the DC collector current input. This DC voltage output of amplifier 28 is applied to the input of the DC servo loop integrator 34. As well known, the latter provides an infinite DC signal gain and an output voltage which is a ramped function of the DC input voltage. Thus, integrator 34 provides an output voltage to the summing junction 14 which in turn applies it to base 14 of transistor 16, maintaining the transistor in the conductive state. Since the integrator 34 has an infinite DC gain, the output of the amplifier 28 tends to go to the referance voltage $V_{ce}$ set by the voltage source 32 resulting in no net current through resistor 30. The output of integrator 34 is thus the DC base-to-emitter voltage $V_{be}$ of transistor 16. The DC $V_{be}$ signal is also applied to an input of the summing junction 36.

In order to provide a DC signal proportional to the transconductance gain of transistor 16 as a function of temperature, a low amplitude, high frequency (preferably over 1 KHz) AC signal is applied to the input terminal 10. The application of the AC input signal produces an AC collector current in transistor 16 independent of the DC signal level. This results in an AC voltage output of the amplifier 28. The DC servo loop integrator 34 should be designed to be too slow to respond to this AC signal output of the amplifier 28 so that it will have no effect on the value of the DC $V_{be}$ signal output of integrator 34.

The AC output of amplifier 28 is proportional to the transconductance gain of the transistor 16. The AC output of amplifier 28 is transmitted through the coupling capacitor 40 to the input of detector 42. It will be appreciated that capacitor 40 will block the DC signal output of amplifier 28. Detector 42 averages the AC signal at its input and preferably provides a DC voltage output as a function of the RMS value of the input signal. This DC voltage output is thus proportional to the transconductance gain. Since a DC signal is desired which is an inverse function of the transconductance gain, as shown in FIG. 2, the DC signal output of detector 42 is inverted by the 1/x circuit 44 to provide a DC signal as a function of $1/g_m$ which in turn is proportional to the operating temperature of transistor 16. The output of circuit 44 is multiplied by the function $K_2$ of multiplier circuit 46 to provide the desired $K_2/g_m$ DC signal, which in turn is applied to the second input of summing junction 36. The particular value of $K_2$ is a function of the type of transistor under test since each type of transistor will exhibit a predetermined $g_m(T)$ function. It should be appreciated that $K_2$ is selected so that the input to junction 36 from circuit 46 varies with temperature in an equal and opposite manner to the signal provided from integrator 34. The two signals are added together to provide a DC voltage signal which will not vary with temperature, but will be at a value at some reference temperature. The actual base-to-emitter voltage at a particular reference temperature can be provided by raising or lowering the DC level of the output of junction 36 by a predetermined amount simply by adjusting the DC offset reference temperature adjust voltage input to junction 36.

The FIG. 5 embodiment can be modified as shown in FIG. 6 so as to combine the operational amplifier 28 and integrator 34 into one stage. More particularly, the terminal 10 is connected through resistor 50 to the positive input of operational amplifier 52, the latter having its negative input connected to ground. The positive input of amplifier 52 is connected through resistor 54 to the negative input of amplifier 56. The positive input of amplifier 52 is tied through feedback resistor 58 to the output of the amplifier 52. The output of amplifier 52 is in turn connected to base 18 of the transistor 16 under test. The emitter 20 of transistor 16 is connected to ground, while the collector 22 of the transistor is connected through resistor 60 to a positive voltage source. The collector 22 of transistor 16 is also connected to the negative input of amplifier 62. The positive input of amplifier 62 is connected to a positive DC voltage source 32 for providing the DC voltage $V_{ce}$. The output of amplifier 62 is connected to feedback resistor 66 which in turn is connected through feedback capacitor 68 to the negative input of amplifier 62. The junction of resistor 66 and capacitor 68 is connected to the positive input of amplifier 56. The output of amplifier 56 is tied to its negative input and is connected to one input of the buffer and summing junction 36. As will be more evident hereinafter the output of amplifier 56 is the DC $V_{be}$ signal.

The output of amplifier 62 is also connected to the averaging detector 42. As in the FIG. 5 embodiment the output of detector 42, representing the DC signal as a function of the transconductance gain $g_m$, is inverted by the 1/x circuit 44 to provide a DC signal as a function of the inverse transconductance gain $1/g_m$. This signal is multiplied by the scaling factor $K_2$ by the multiplier 46 which in turn provides the $K_2/g_m$ DC signal to the second input of junction 36.

In operation a DC collector current is provided through transistor 16 by the supplied voltage applied across resistor 60. This collector current is applied to the negative input of amplifier 62. Feedback capacitor 68 functions as an integrator of this DC current so as to provide a DC signal to the positive input of amplifier 56. The latter converts the DC current to a DC voltage. This DC voltage output of amplifier 56 is the DC $V_{be}$ signal which forms one input to the junction 36. The low amplitude high frequency signal applied to terminal 10 is converted to an AC voltage signal and applied to the base 18 of transistor 16. This generates an AC signal in the collector of transistor 16 which AC signal is applied to the negative input of amplifier 62. This provides an AC signal output of amplifier 62 which is a function of the transconductance gain $g_m$ of transistor 16. This AC signal is averaged by detector 42 to provide a DC signal representative of the transconductance gain. As in the FIG. 5 embodiment the signal is inverted by the 1/x circuit and multiplied by the factor $K_2$ by multiplier circuit 46 to provide a DC signal proportional to $K_2/g_m$ function of temperature. The output of amplifier 56 and circuit 46 are added together as well as to the DC offset signal to provide an output signal equal to the base-to-emitter voltage at a predetermined reference temperature.

It will be appreciated that in both embodiments, the technique is to multiply the DC $1/g_m$ signal by the factor $K_2$ in order that the resulting signal varies as a function of temperature with the DC $V_{be}$ signal in an equal and opposite manner. Although this is preferred since $K_2$ is less than 1 and therefore circuit 46 need only be a scaler such as a variable resistor, alternatively a multiplier circuit could be used to multiply the DC $V_{be}$ signal by a factor equal to $1/K_2$ or both signals can be multiplied by an appropriate factor.

The apparatus of FIGS. 5 and 6 as well as the method carried out by these apparatus is an improved system for and technique of testing transistors for their $V_{be}$-$I_c$ characteristics independently of temperature, without the need of a testing oven and the costs associated therewith.

Since certain changes may be made in the above processes and apparatus without departing from the scope of the invention herein involved, it is intended that all matters contained in the above description or shown in the accompanying drawing shall be interpreted in an illustrative and not in a limiting sense.

What is claimed is:

1. A system for testing a transistor for its $V_{be}$-$I_c$ characteristics independent of temperature, said system comprising
    means for generating a first signal which varies with temperature in accordance with the base-to-emitter voltage of said transistor as a function of temperature;
    means for generating a second signal which varies with temperature in accordance with the transconductance gain of said transistor as a function of temperature;
    means for modifying at least one of said signals so that as modified said first and second signals vary with temperature in a substantially equal and opposite manner to one another; and
    means for adding said first and second signals as modified so as to provide an output signal representative of the $V_{be}$-$I_c$ characteristics of said transistor independent of temperature.

2. A system according to claim 1 wherein said means for generating said first signal includes means for generating a constant collector current through the collector of said transistor.

3. A system according to claim 2, wherein said means for generating said first signal further includes means for converting said collector current to a DC voltage and means for integrating said voltage so as to produce said first signal.

4. A system according to claim 3, wherein said means for integrating said DC voltage includes a DC servo loop integrator having its input connected to receive said DC voltage and its output coupled to the base of said transistor.

5. A system according to claim 3, wherein means for integrating said DC voltage includes an operational amplifier and an integrating feedback capacitor connected between an input and output of said operational amplifier.

6. A system according to claim 1, wherein said means for generating said second signal includes means for applying an AC input signal to the base of said transistor so as to generate a second AC signal in the collector of said transistor as a function of the transconductance gain of said means for averaging said second AC signal so as to provide a DC signal as a function of said transconductance gain, and means responsive to said DC signal for inverting said DC signal so as to provide said second signal.

7. A system according to claim 6, wherein said means for modifying at least one of said signals includes multiplier means for multiplying said second signal by a constant factor to provide a modified second signal, said constant factor being such that said first signal and said modified second signal vary with temperature in an equal and opposite manner to one another.

8. A method of testing the base-to-emitter voltage-collector-current characteristics of a transistor independent of temperature, said method comprising the steps of:
    providing a constant DC current through the collector of said transistor,
    generating a first DC signal in response to said constant DC current, said first DC signal varying with temperature in accordance with the base-to-emitter voltage of said transistor as a function of temperature;
    applying an AC signal to the base of said transistor,
    generating in response to said applied AC signal a second AC signal in the collector of said transistor, said second AC signal being representative of the transconductance gain of said transistor;
    converting the second AC signal to a second DC signal which varies with temperature in accordance with the transconductance gain of said transistor as a function of temperature;
    modifying at least one of said first and second DC signals so that said first and second DC signals vary with temperature in a substantially equal and opposite manner; and
    adding the first and second DC signals, as modified so as to provide a DC signal equal to the base-emitter voltage of said transistor at a predetermined temperature independent of the operating temperature of said transistor.

9. A method according to claim 8, wherein said step of modifying includes inverting said second signal so as to provide a third DC signal which is a function of the inverse of said transconductance gain.

10. A method according to claim 9, wherein said step of modifying further includes means for multiplying said third DC signal by a constant factor.

* * * * *

UNITED STATES PATENT AND TRADEMARK OFFICE
CERTIFICATE OF CORRECTION

PATENT NO. : 4368425
DATED : January 11, 1983
INVENTOR(S) : Robert W. Adams

It is certified that error appears in the above-identified patent and that said Letters Patent are hereby corrected as shown below:

In claim 5, column 8, line 6, the word "said" should be inserted before the word -- means --.

Signed and Sealed this

Twenty-second Day of March 1983

[SEAL]

Attest:

GERALD J. MOSSINGHOFF

Attesting Officer     Commissioner of Patents and Trademarks